United States Patent [19]
Oden et al.

[11] Patent Number: 5,366,817
[45] Date of Patent: Nov. 22, 1994

[54] PROCESS FOR MITIGATING CORROSION AND INCREASING THE CONDUCTIVITY OF STEEL STUDS IN SODERBERG ANODES OF ALUMINUM REDUCTION CELLS

[75] Inventors: Laurance L. Oden; Jack C. White, both of Albany; James A. Ramsey, The Dalles, all of Oreg.

[73] Assignee: The United States of America as represented by the Secretary of the Interior, Washington, D.C.

[21] Appl. No.: 874,139

[22] Filed: Apr. 27, 1992

[51] Int. Cl.⁵ ............................................. B32B 15/00
[52] U.S. Cl. .................................. 428/653; 427/250; 427/280; 427/307; 427/328; 427/580
[58] Field of Search ............... 427/250, 280, 307, 328, 427/680; 428/653

[56] References Cited

U.S. PATENT DOCUMENTS

| | | | |
|---|---|---|---|
| 4,619,557 | 10/1986 | Salama | 427/456 X |
| 4,663,181 | 5/1987 | Muralli | 427/456 |
| 4,827,734 | 5/1989 | Buus | 427/456 X |

Primary Examiner—Bernard Pianalto
Attorney, Agent, or Firm—E. Philip Koltos

[57] ABSTRACT

A corrosion resistant electrically conductive coating on steel anode studs used in the production of aluminum by electrolysis.

18 Claims, 1 Drawing Sheet

PROCESS FOR MITIGATING CORROSION AND INCREASING THE CONDUCTIVITY OF STEEL STUDS IN SODERBERG ANODES OF ALUMINUM REDUCTION CELLS

TECHNICAL FIELD

This invention relates to anodes for Soderberg electrolytic cells for the production of aluminum, and specifically to a process for reducing anode stud corrosion such that anode voltage losses are decreased and metal purity is increased.

BACKGROUND ART

Aluminum smelters in 1988 consumed approximately 2.5% of the electrical energy generated in the United States, or about 65,000 GW h, of which 14,000 GW h was consumed by smelters using the Soderberg technology. Domestic capacity by Soderberg aluminum smelters in 1988 was 853,000 metric tons, or 21.6% of total domestic capacity.

The Soderberg system is a continuous method for feeding anode carbon. The anode is formed within a rectangular steel shell by the sintering of a loose mixture of petroleum coke and coal tar pitch added to the top. Steel studs conduct electricity to the anode of the cell and also function to support the anode, which is the upper electrode of the cell. A typical 105,000-A Soderberg cell requires 46 to 50 studs. The present state of the art is to remove 15 to 20 studs per week from the anode of an operating aluminum reduction cell, partially fill the resulting holes with a mixture of coal tar pitch and coke, then reset freshly sand or grit blasted studs into the holes at a higher level. The temperature of the tip of the studs is about 900° C. when they are pulled, and they are reset into an environment of about 650° C. At these high temperatures, sulfur and carbon in the coke and pitch react with the steel studs to form a brittle crystalline layer of corrosion product that is principally iron sulfide. The layer of corrosion product is 0.1 to 0.2 inches thick on the surface of the stud at the tip where the temperature is the highest. This layer of corrosion product increases the electrical resistance of the stud and increases the voltage drop across the cell. The steel studs adhere strongly to the carbon of the anode and require a severe twist to disengage from the carbon. The act of disengagement leaves part of the corrosion product within the anode. The state of the art does nothing to mitigate corrosion of the studs, but the remaining corrosion product is removed by sand or grit blasting prior to resetting the studs at a higher level in the anode. The corrosion product left within the anode ultimately reports to and degrades the product metal as the anode is consumed. Approximately 20% of the iron impurity in product aluminum is traceable to the steel studs.

Those concerned with these and other problems recognize the need for an improved process for mitigating corrosion and increasing the conductivity of steel studs in Soderberg anodes of aluminum reduction cells.

DISCLOSURE OF THE INVENTION

The present invention provides a corrosion resistant electrically conductive coating on steel anode studs used in the production of aluminum by electrolysis.

An object of the present invention is the provision of an improved process that could decrease the power requirement by 6 kW h/metric ton of aluminum for a total possible saving of 5,000 MW h.

Another object is to provide a process that would decrease costs for domestic aluminum and would improve the competitive position of domestic producers in the world market, thereby improving the import-export imbalance.

A further object of the invention is the provision of a process that would result in aluminum of greater purity and that would allow additional savings to accrue to the Nation owing to decreased consumption of electricity by the aluminum industry, with commensurate decreased pollution by power generating stations.

Still another object is to provide a process that would lessen the environmental impact of aluminum smelting.

These and other attributes of the invention will become more clear upon a thorough study of the following description of the best mode for carrying out the invention.

DESCRIPTION OF THE DRAWING

Other objects and advantages of the invention will become apparent upon reading the following detailed description and upon reference to the drawing, in which:

figure is a cross sectional view of a Soderberg stud coated with aluminum or an aluminum alloy according to the process of the instant invention.

Figure 1:
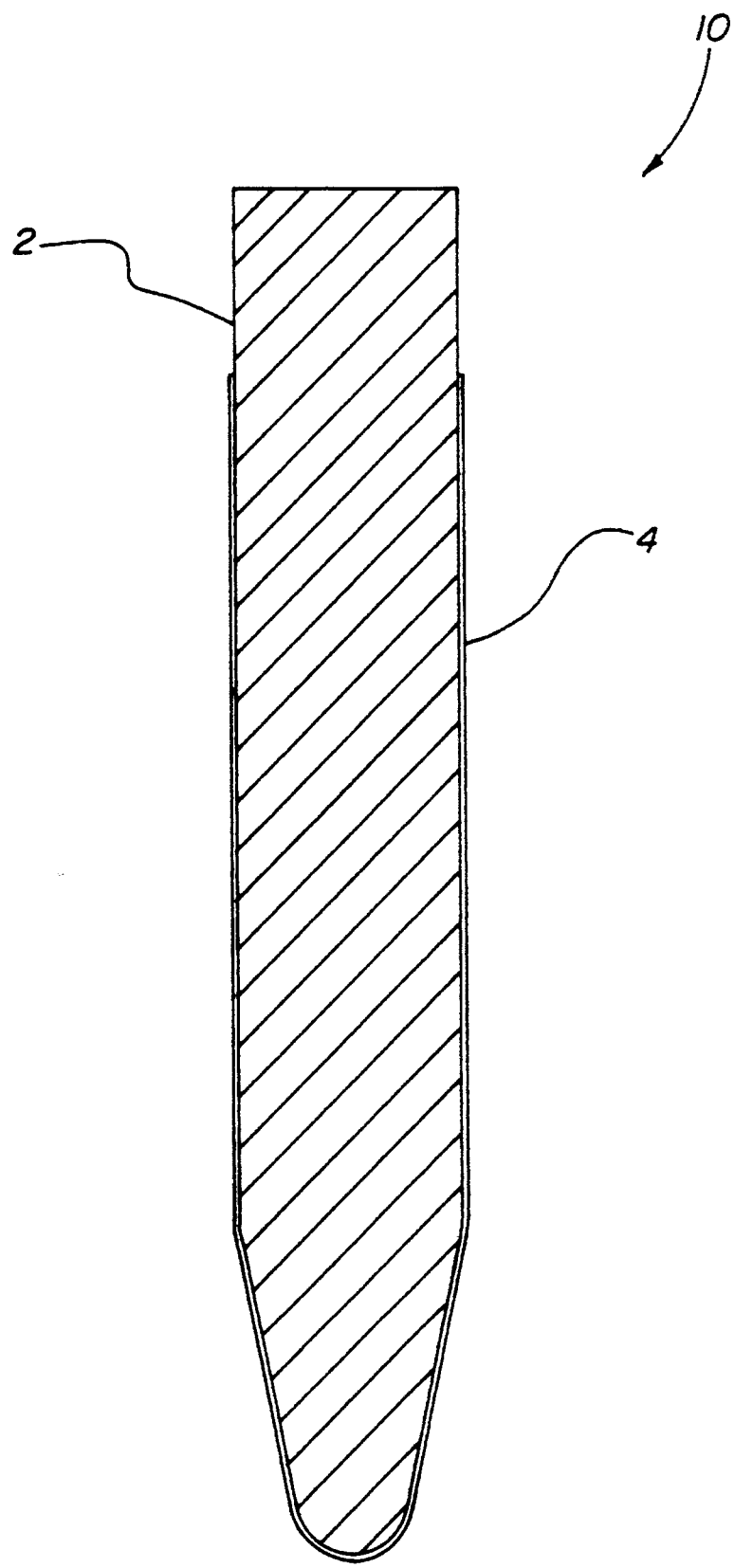

While the invention will be described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

BEST MODE FOR CARRYING OUT THE INVENTION

The process of the invention constitute the deposition of aluminum or alloys containing aluminum (the FIG. 4) on the surface (the FIG., 2) of steel Soderberg studs (the FIG., 10) for the purpose of decreasing corrosion of the studs. Corrosion consists of sulfidation and carburization of the Soderberg studs by carbon, sulfur, and compounds containing sulfur within the coke and coal tar pitch of the anode. Aluminum, when applied to the surface of the steel studs as the pure metal or as an alloy, diffuses into and reacts with the steel at the operating temperature of the Soderberg stud to form a coating that is very resistant to sulfidation and carburization. The coating advantageously consists of a solid solution of aluminum in iron, the intermetallic compounds $Fe_3Al$ and $FeAl$, or mixtures of these phases.

Two coating methods for applying aluminum to Soderberg studs are disclosed. They are vapor deposition of aluminum onto the studs at high temperature by a proprietary commercial process (Alonizing by Alon Processing Co. Inc. of Tarrentum, Pa.) and arc spraying of pure aluminum and 25.5 weight percent Al—74.5 weight percent Fe alloy onto the studs at room temperature.

In the embodiment using vapor deposition of pure aluminum at high temperature, an alloy of aluminum and iron forms by diffusion as aluminum is deposited on the surface of the steel. The concentration of aluminum in the alloyed surface decreases from 10 to 25 weight percent at the surface to nil in about 0.01 inch.

In the embodiment using arc spraying, the steel studs are pretreated by sand or grit blasting to provide a clean and roughened surface prior to arc spraying. The roughened surface is needed to obtain firm mechanical attachment of the arc sprayed metal to the surface of the studs. The arc spraying embodiment is very versatile in that any alloy composition can be applied to any desired thickness.

The coatings reduced to practice are pure aluminum and a mixture of equal volumes of aluminum and iron, which has the composition 25.5 weight percent Al—74.5 weight percent Fe. The arc sprayed studs are immediately placed in service in the anode of an operating Soderberg cell where diffusional alloying of the aluminum with the steel stud occurs in-situ at the temperature of the anode. A thicker layer of corrosion resistant alloy is formed by applying an alloy of aluminum and iron or a mixture of aluminum and iron. Both coating methods, vapor deposition and arc spraying, produce the desired decrease in corrosion and increase in electrical conductivity of the studs, as illustrated in the example.

Alternate methods of the invention to apply aluminum to the surface of steel Soderberg studs could be to include flame spraying, plasma spraying, hot dipping, chemical vapor deposition, electrochemical deposition, welding, application of a slurry or suspension of aluminum powder in a suitable liquid vehicle by brush, roller, dip or spray painting, and other methods familiar to anyone skilled in the art. The appropriate alloy composition for corrosion resistance ranges from pure aluminum to alloys containing aluminum, including alloys between aluminum and iron containing as little as 4 percent Al by weight. The preferred composition for aluminum-iron alloys is in the range of 10 to 25 percent Al by weight. However, it is to be understood that the natural tendency for aluminum and iron to interdiffuse into each other at the operating temperature of the Soderberg anode (650° to 900° C.) renders the composition of the initial coating of little importance.

EXAMPLE

Five new steel studs were grit-blasted and coated with aluminum by arc spraying and set in the same positions in the anodes of five different operating 105,000 ampere Soderberg cells. Five new studs, grit blasted and coated by arc spraying with equal volumes of aluminum and iron, also were set in the same anodes at equivalent positions. Ten new grit blasted studs also were set in the same anodes in equivalent positions. After the studs had been in place for 13 days, the current carried by each was measured and recorded for 7 consecutive days. The current carried by each stud, averaged over the 7 day period, is listed in the following table. The data indicates that the studs coated with aluminum and aluminum-50 volume percent iron carried 15.9 percent and 14.7 percent more current, respectively, than the new uncoated studs.

TABLE 1

| Stud Condition | Current Carried by Soderberg Studs Average amperes for 7 day period |
| --- | --- |
| Coated with Al | 2862 |
| Coated with Al-50 volume percent Fe | 2832 |

TABLE 1-continued

| Stud Condition | Current Carried by Soderberg Studs Average amperes for 7 day period |
| --- | --- |
| New studs | 2469 |

Thus, it can be seen that at least all of the stated objectives have been achieved.

Obviously, many modifications and variations of the present invention are possible in light of the above teachings. It is therefore to be understood that, within the scope of the appended claims, the invention may be practiced otherwise than as specifically described.

We claim:

1. A process for decreasing corrosion of steel Soderberg studs during production of aluminum by electrolysis, comprising the step of coating the surface of said studs with a coating material comprising a member selected from the group consisting of aluminum and an alloy containing aluminum, said coating material being resistant to sulfidation and carburization.

2. The process of claim 1, wherein said coating material comprises aluminum.

3. The process of claim 1, wherein said coating material comprises an alloy containing aluminum.

4. The process of claim 3, wherein said aluminum alloy comprises $Fe_3Al$.

5. The process of claim 3, wherein said aluminum alloy comprises FeAl.

6. The process of claim 1, wherein said step of coating is accomplished by vapor deposition.

7. The process of claim 1, wherein said step of coating is accomplished by arc spraying.

8. The process of claim 7, wherein said step of coating is accomplished with a mixture of 25.5 weight percent Al and 74.5 weight percent Fe alloy onto a Soderberg stud maintained at room temperature.

9. The process of claim 1, further comprising the step of cleaning the surface of said Soderberg stud prior to said coating step.

10. The process of claim 1, further comprising the step of decreasing the smoothness of the surface of said Soderberg stud prior to said coating step.

11. An apparatus for decreasing energy consumption during the production of aluminum by electrolysis, comprising:
    (a) a Soderberg stud having an outer surface; and
    (b) a corrosion resistant material comprising a member selected from the group consisting of aluminum and an alloy containing aluminum covering the outer surface of said Soderberg stud.

12. The apparatus of claim 11, wherein said corrosion resistant material comprises aluminum.

13. The apparatus of claim 11, wherein said corrosion resistant material comprises and alloy containing aluminum.

14. The apparatus of claim 13, wherein said aluminum alloy comprises $Fe_3Al$.

15. The apparatus of claim 13, wherein said aluminum alloy comprises FeAl.

16. The apparatus of claim 11, wherein said corrosion resistant material is deposited on the surface of said Soderberg stud by vapor deposition.

17. The apparatus of claim 11, wherein said corrosion resistant material is deposited on the surface of said Soderberg stud by arc spraying.

18. The apparatus of claim 17, wherein said corrosion resistant material is a mixture of 25.5 weight percent Al and 74.5 weight percent Fe alloy.

\* \* \* \* \*